(12) United States Patent
Franke et al.

(10) Patent No.: US 10,554,200 B2
(45) Date of Patent: Feb. 4, 2020

(54) PEAK DETECTION METHODS, APPARATUS, AND CIRCUITS

(71) Applicant: Texas Instruments Incorporated, Dallas, TX (US)

(72) Inventors: Maxim James Franke, Dallas, TX (US); Michael Ryan Hanschke, Dallas, TX (US); Antonio Amoroso, Tremestieri Etneo (IT); Rosario Stracquadaini, San Gregorio di Catania (IT)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/214,770

(22) Filed: Dec. 10, 2018

(65) Prior Publication Data

US 2020/0007115 A1    Jan. 2, 2020

Related U.S. Application Data

(60) Provisional application No. 62/691,121, filed on Jun. 28, 2018.

(51) Int. Cl.
*H02M 1/42*    (2007.01)
*H03K 5/1532*    (2006.01)
*H02M 1/32*    (2007.01)

(52) U.S. Cl.
CPC .......... *H03K 5/1532* (2013.01); *H02M 1/32* (2013.01); *H02M 1/4208* (2013.01)

(58) Field of Classification Search
CPC .... H02M 1/42; H02M 1/4208; H02M 1/4225; H02M 3/156; H02M 7/217; H02M 2001/0022
See application file for complete search history.

(56) References Cited

U.S. PATENT DOCUMENTS 8,379,423 B2 * 2/2013 Park ............ H02M 1/4225
                                              323/222
9,660,519 B2    5/2017 Maruyama
(Continued)

FOREIGN PATENT DOCUMENTS

RU    2186403 C2    7/2002

OTHER PUBLICATIONS

Search Report for PCT Application No. PCT/US19/38650 date of mailing of the international search report dated Oct. 14, 2019, 1 page.

*Primary Examiner* — Gary L Laxton
(74) *Attorney, Agent, or Firm* — Tuenlap Chan; Charles A. Brill; Frank D. Cimino

(57) ABSTRACT

Peak detection methods, apparatus, and circuits are disclosed. An example peak detector includes a first peak-hold circuit having a first input terminal and a first output terminal, the first peak-hold circuit to determine a first peak of a rectified input voltage at the first input terminal during a first time interval, and to track a second peak of the rectified input voltage during a second time interval, the second time interval distinct from the first time interval, and a second peak-hold circuit having a second input terminal and a second output terminal, the second peak-hold circuit to determine, during the second time interval, a greater of the first peak and the second peak, the first output terminal coupled to the second input terminal, the greater of the first peak and the second peak output at the second output terminal.

19 Claims, 6 Drawing Sheets

(56) References Cited

U.S. PATENT DOCUMENTS

| | | | |
|---|---|---|---|
| 10,153,689 B2 * | 12/2018 | Colbeck | ............... H02M 1/42 |
| 2014/0117947 A1 | 5/2014 | Lai et al. | |
| 2016/0233759 A1 | 8/2016 | Colbeck | |

* cited by examiner

PEAK DETECTION METHODS, APPARATUS, AND CIRCUITS

RELATED APPLICATION

This patent claims priority to and claims the benefit of U.S. Provisional Patent Application Ser. No. 62/691,121, which was filed on Jun. 28, 2018. U.S. Provisional Patent Application Ser. No. 62/691,121 is hereby incorporated herein by reference in its entirety.

FIELD OF THE DISCLOSURE

This disclosure relates generally to peak detectors, and, more particularly, to peak detection methods, apparatus, and circuits.

BACKGROUND

Power factor correction (PFC) controllers for alternating current (AC) to direct current (DC) converters detect peak voltages on an AC rectified line and adjust the charging time of an output power stage to compensate for AC line voltage changes. The goal of PFC is to match the power consumption measured by an AC supply with the power actually consumed by a DC load. PFC controllers use the detected peaks to shape the current supplied to the DC load, so the DC load appears substantially real (e.g., substantially resistive) to the AC supply.

Figure 1:
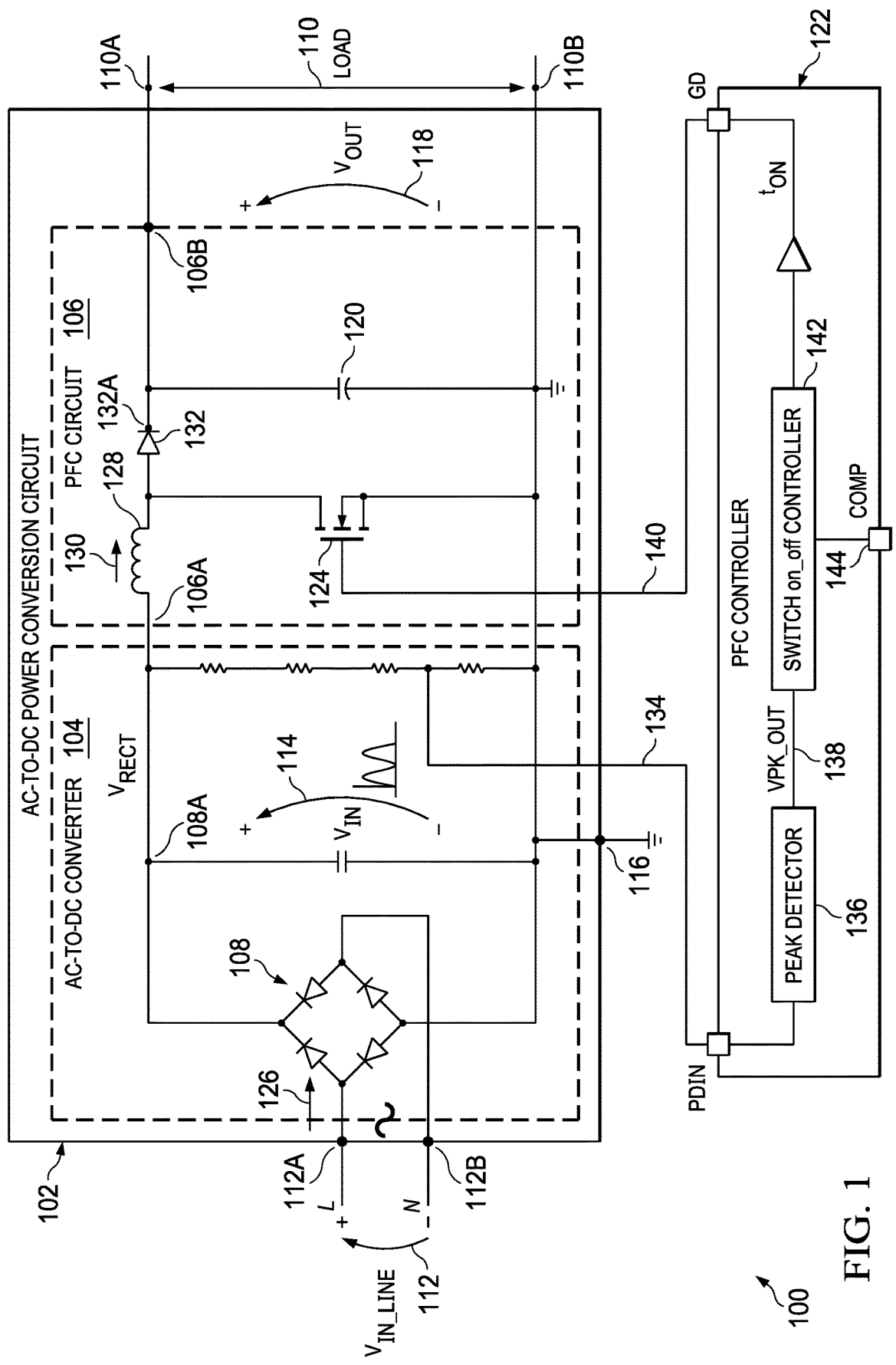
FIG. 1 illustrates an example PFC controller having a peak detector constructed in accordance with teachings of this disclosure and shown in an example power converter.

In general, the same reference numbers will be used throughout the drawing(s) and accompanying written description to refer to the same or like parts. Connecting lines or connectors shown in the various figures presented are intended to represent example functional relationships and/or physical or logical couplings between the various elements.

DETAILED DESCRIPTION

Adjustment of the charging time of the power stage of an AC-to-DC power converter to compensate for line voltage changes is referred to as line voltage feed forward of PFC. The effectiveness of line voltage feed forward strongly depends on the accuracy of peak detection for the line voltage. Example digital solutions perform peak detection by digitizing an input line voltage. Once the input line voltage is digitally captured, digital comparators and memory registers can be used to determine the feed forward signal. Prior digital solutions are complex, relying on high-resolution analog-to-digital converters (ADCs), low-resolution non-linear ADCs, high-fidelity sampling techniques/circuits, precision comparators, digital decoders, etc. that have significant area, accuracy, complexity, etc. requirements. Additional prior solutions use complex filters to convert an input line voltage to a ramp signal that controls a pulse width modulator (PWM).

Disclosed herein are cost-efficient, simple line voltage peak detection methods, apparatus, systems and circuits that overcome at least the deficiencies and complexities of digital and filter-based solutions. The disclosed line voltage peak detection methods, apparatus, systems and circuits are able to track positive line transients (e.g., as they occur), and sense and track negative line transients within three-quarters of a wave cycle. A three-quarters wave cycle refers the portion of an AC signal falling between a zero crossing and the peak following the next zero crossing. Disclosed examples track positive line transients by generally, closely, immediately, instantaneously, substantially, effectively, essentially, etc. tracking the shape and characteristics of positive line transients, ignoring incidental processing time, incidental signal propagation time, etc. The disclosed methods, apparatus, systems and circuits realize precise, fast and responsive line voltage feed forward for AC-to-DC converters that compensate for positive line voltage transients, reduce (e.g., minimize) the impact of negative line voltage transients, and/or compensate for asymmetric peaks that may occur during full wave cycles. Positive line voltage transients may result in damage in the power stage and/or circuits connected to the regulated output. While negative line voltage transients may result in a longer undershoot of the regulated output, they are generally more acceptable as they are not associated with damage.

Reference will now be made in detail to non-limiting examples, some of which are illustrated in the accompanying drawings.

FIG. 1 is a diagram of an example power converter 100 having an example AC-to-DC power conversion circuit 102. The example AC-to-DC power conversion circuit 102 includes an example AC-to-DC converter circuit 104, and an example PFC circuit 106. The example PFC circuit 106 has an input terminal 106A and an output terminal 106B. The input terminal 106A of the PFC circuit 106 is connected to (e.g., coupled to directly and/or indirectly) an output terminal 108A of an example rectifier 108 of the AC-to-DC converter circuit 104. The output terminal 106B of the PFC circuit 106 is connected to a terminal 110A of a load 110 to which the AC-to-DC power conversion circuit is supplying DC power. Another terminal 110B of the load 110 is connected to ground.

The example rectifier 108 of FIG. 1 converts an AC input line voltage $V_{IN\_LINE}$ 112 across input terminals 112A and 112B of the AC-to-DC power conversion circuit 102 to a rectified input line voltage $V_{IN}$ 114 (e.g., a rectified AC input line voltage) across the output terminal 108A of the rectifier 108 and a ground terminal 116. The PFC circuit 106 forms an output voltage $V_{OUT}$ 118 across a capacitor 120 from the rectified input line voltage $V_{IN}$ 114.

To improve the quality of the output voltage $V_{OUT}$ 118 generated by the AC-to-DC power conversion circuit 102, the example power converter 100 of FIG. 1 includes an example PFC controller 122. The example PFC controller 122 controls the example PFC circuit 106 to increase the power factor of the power converter 100. The power factor of an AC electrical power system refers to the ratio of the real power (e.g., defined as the average value of the electrical power input in the system over one line cycle) to the apparent power (e.g., defined as the product of input voltage RMS value and the input current RMS value to the power system), and is a dimensionless number in the closed interval of 0 to 1. In an electric power system, a load with a low power factor draws more current than a load with a high power factor for a given amount of useful power transferred.

The example PFC controller 122 of FIG. 1 turns a switch 124 of the PFC circuit 106 off and on with a varying duty cycle to form an AC input current 126 that is sinusoidal and in phase with the AC input voltage $V_{IN\_LINE}$ 112. When the AC input current 126 is sinusoidal and in phase with the AC input voltage $V_{IN\_LINE}$ 112, the load 110 appears to a source of the AC input voltage $V_{IN\_LINE}$ (e.g., a power company) as a purely real load and, thus, power can be provided to the load 110 with a high power factor. In some examples, the example PFC controller 122 is implemented using one or more analog circuits.

In operation, the PFC controller 122 cycles the PFC circuit 106 between two states. The first state occurs when the PFC controller 122 closes the switch 124 (e.g., turns on a field effect transistor (FET)). In this state, an example inductor 128 is energized via the rectifier 108, thereby an inductor current 130 flowing through the inductor 128 increases. At the same time, a diode 132 becomes reverse biased (because its anode terminal 132A is connected to the ground), thereby energy is provided to the load 110 by the capacitor 120. In a second state, the PFC controller 122 opens the switch 124 (e.g., turns off the FET). In this state, the inductor 128 de-energizes and the inductor current 130 decreases as the inductor 128 supplies energy to the load 110 and for recharging the capacitor 120.

The example PFC controller 122 of FIG. 1 controls the cycling of the PFC circuit 106 between the above-described two states. Cycling back and forth between the states is done rapidly (e.g., at a high frequency such as tens or hundreds of kilohertz (kHz)) and in a manner that controls the power factor of the power converter 100 by maintaining an output voltage $V_{OUT}$ 118 that is constant and controls an average of the inductor current 130, and subsequently an average of the AC input current 126.

Because the inductor current 130 is increasing in the first state and decreasing in the second state, the duty cycle at which the PFC controller 122 opens and closes the switch 124 determines the amount of time the inductor current 130 flowing through the inductor 128 is increasing, versus the amount of time the inductor current 130 flowing through the inductor 128 is decreasing. By varying the duty cycle at which the switch 124 operates, the PFC controller 122 can control an average of the inductor current 130. By controlling an average of the inductor current 130 to track the expected current consumed by the load 110, the power factor and total harmonic distortion (THD) can be significantly improved. For an ideal system, the inductor current 130 is a rectified sine wave, the AC input current 126 is a sine wave, and the inductor current 130 and the AC input current 126 are phased to match each other and VIN_LINE. The purpose of the PFC is to make the shape and magnitude of the load not impact the phasing of the AC input current 124 and the inductor current 130. A DC load for example has no "phase".

To detect and track peaks and sense negative transients of a peak detector input voltage PDIN (e.g., a waveform, a signal, etc.) on a line 134, the example PFC controller 122 of FIG. 1 includes a peak detector 136. As described in more detail below in connection with FIG. 2, the example peak detector 136 generates an output voltage VPK_OUT on a line 138 that immediately tracks peaks of the peak detector input voltage PDIN on the line 134, and tracks reduction of magnitude of peak detector input voltage PDIN on the line 134 within a time interval corresponding to a half wave cycle plus a quarter of a line cycle of the AC input line voltage $V_{IN\_LINE}$ 112.

To generate a control signal on the line 140 for the switch 124, the example PFC controller 122 of FIG. 1 includes an example switch on_off controller 142 that generates the control signal on the line 140 based on peaks detected by the peak detector 136. The example switch on_off controller 142 generates the control signal on the line 140 to have a pulse width PW, which can be expressed mathematically as PW=ton_constant*COMP/$VPK\_OUT^2$, where:

the pulse width PW is measured in time in seconds,
ton_constant is a constant that converts COMP/VPK_OUT$^2$ in units of Volts*seconds to time in seconds,
COMP is a voltage on a terminal 144, and
the output voltage VPK_OUT on the line 138 is determined by the peak detector.

The time from one pulse to the next pulse (switching period) can vary according to how the PFC controller 122 works. In some examples, a fixed switching period based on a controller's internal oscillator (e.g., a controller that implements a continuous conduction Mode (CCM)). Switching period can change cycle-by-cycle if different control strategies are used. For example, in a transition mode (TrM), the switch 124 is turned on when inductor currents decay to zero. In some examples, an error amplifier (e.g., internal to the PFC controller 122) compares a voltage proportional to the output voltage VOUT on the load 110, with a reference (e.g., internal to the PFC controller 122) and increases COMP if the voltage proportional to VOUT on the line is below the reference, and decreases COMP if the voltage proportional to VOUT on the line is above the reference. In some examples, COMP is changed slowly enough that it can be considered constant over a line cycle.

While an example manner of implementing the power converter 100 is illustrated in FIG. 1, one or more of the elements, processes and/or devices illustrated in FIG. 1 may be combined, divided, re-arranged, omitted, eliminated and/or implemented in any other way. Further still, the example power converter 100 of FIG. 1 may include one or more elements, processes and/or devices in addition to, or instead of, those illustrated in FIG. 1, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 2:
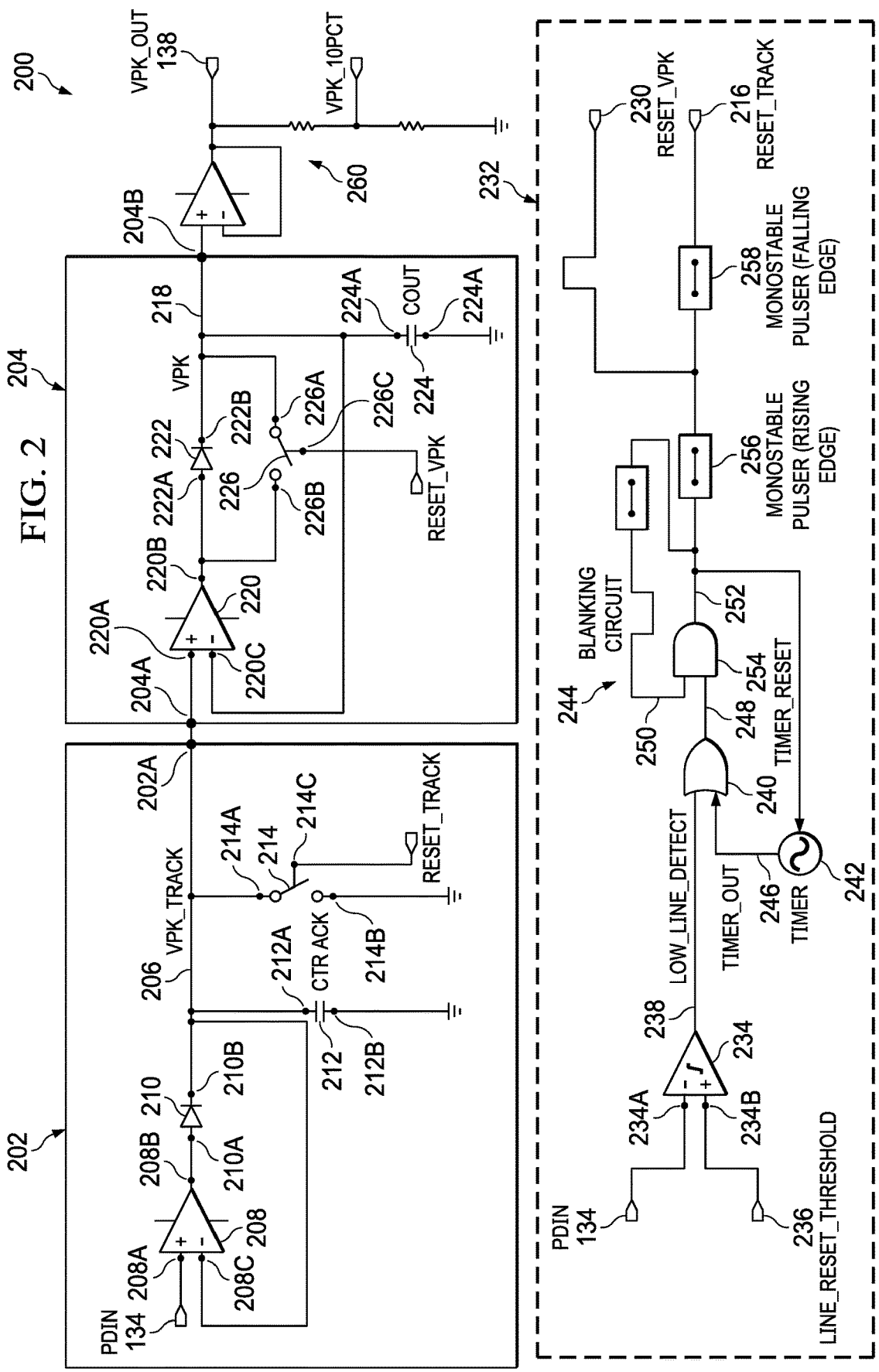
FIG. 2 is a diagram of an example peak detector circuit that may be used to implement the example peak detector of FIG. 1.

FIG. 2 is a diagram of an example peak detector 200 (e.g., peak detector circuit) that may be used to implement the example peak detector 136 of FIG. 1. To track the peak detector input voltage PDIN on the line 134, the example peak detector 200 includes example peak detector circuits 202 and 204. The example peak detector circuits 202 and 204 of FIG. 1 are analog peak-hold circuits that are connected in a pipeline, serial, etc. configuration. An output terminal 202A of the peak detector circuit 202 is connected to an input terminal 204A of the peak detector circuit 204.

The first peak detector circuit 202 of FIG. 2 includes an example analog peak-hold circuit that continuously tracks the highest peak of the peak detector input voltage PDIN on the line 134 for the current half wave cycle as an example voltage VPK_TRACK on a line 206. The example peak detector circuit 202 includes an example operational amplifier 208 having a first input terminal 208A connected the peak detector input voltage PDIN on the line 134, and having an output terminal 208B connected to a terminal 210A of an example diode 210. Another terminal 210B of the diode 210 is connected to a second input terminal 208C of the operational amplifier 208, is connected to a terminal 212A of an example capacitor CTRACK 212, and is connected to the output terminal 202A of the peak detector circuit 202. Another terminal 212B of the capacitor CTRACK 212 is connected to ground. A terminal 214A of a switch 214 is connected to the terminal 210B of the diode 210, and a second terminal 214B of the switch 214 is connected to ground.

The example peak detector circuit 202 tracks and holds the highest peak of the peak detector input voltage PDIN on the line 134 as the voltage VPK_TRACK on the line 206. The peak is held until an example reset signal RESET_TRACK on a line 216, which is connected to a control terminal 214C of the switch 214, closes the example switch 214, thereby discharging the example capacitor CTRACK 212 and resetting the output voltage VPK_TRACK on the line 206 to, for example, a small or minimal value (e.g., zero). In tracking operation, the peak detector input voltage PDIN on the line 134 charges the capacitor CTRACK 212, and the example diode 210 prevents the capacitor CTRACK 212 from discharging. If the peak detector input voltage PDIN on the line 134 increases further, the capacitor CTRACK 212 is further charged to the higher voltage. If the peak detector input voltage PDIN on the line 134 decreases below the previous peak value, the voltage on the capacitor CTRACK 212 stays at the previous peak value.

The second peak detector circuit 204 of FIG. 2 is another example analog peak-hold circuit that continuously tracks the greater, larger, etc. of: (a) the peak VPK_TRACK on the line 206 of the current half wave voltage as tracked by the first peak detector circuit 202), and (b) the peak of the previous half wave cycle held as a voltage VPK on a line 218 by the second peak detector circuit 204. The example peak detector circuit 204 includes an example operational amplifier 220 having a first input terminal 220A connected the input terminal 204A of the peak detector circuit 204, and having an output terminal 220B connected to a terminal 222A of an example diode 222. Another terminal 222B of the diode 222 is connected to a second input terminal 220C of the operational amplifier 220, is connected to a terminal 224A of an example capacitor COUT 224, and is connected to an output terminal 204B of the peak detector circuit 204. Another terminal 224B of the capacitor COUT 224 is connected to ground. A first terminal 226A of a switch 226 is connected to the terminal 222B of the diode 222, and a second terminal 226B of the switch 226 is connected to the terminal 222A of the diode 222.

At half wave line cycle transitions, a reset signal RESET_VPK on the line 230, which is connected to the terminal 226C of the switch 226, causes the example switch 226 to close, thereby bypassing the example diode 222 to allow the voltage VPK_TRACK on the line 206 (even if lower than the voltage VPK on the line 218) to be buffered and held as the voltage VPK on the line 218. That is the output voltage VPK on the line 218 of the peak detector circuit 204 is set to the output voltage VPK_TRACK on the line 206 of the peak detector circuit 202. The reset signal RESET_VPK on the line 230 for the second peak detector circuit 204 occurs prior to the reset signal RESET_TRACK on the line 216 for the first peak detector circuit 202. Thereby, the peak voltage VPK_TRACK on the line 206 for the current half wave cycle is transferred from the first peak detector circuit 202 to the second peak detector circuit 204 as the voltage VPK on the line 218 prior to the voltage VPK_TRACK on the line 206 being reset at the first peak detector circuit 202. To generate control signals for the peak detector circuits 202 and 204, the example peak detector 200 includes an example control signal generator circuit 232. The example control signal generator circuit 232 generates the reset signal RESET_TRACK 216 and the reset signal RESET_VPK on the line 230.

To determine whether to start resets of the peak detector circuits 202 and 204, the example control signal generator circuit 232 of FIG. 2 includes an example comparator 234 that compares the peak detector input voltage PDIN on the line 134 on a first input 234A of the comparator 234 to a threshold LINE_RESET_THRESHOLD on a line 236 at a second input 234B of the comparator 234. Near the end of each half wave cycle, the peak detector input voltage PDIN on the line 134 will nominally satisfy the threshold LINE_RESET_THRESHOLD on the line 236 by falling below the threshold LINE_RESET_THRESHOLD on the line 236, thereby causing a logic rising edge on an output LOW_LINE_DETECT on a line 238 by the comparator 234.

The value of LINE_RESET_THRESHOLD on the line 236 is selected to detect a zero crossing. Additionally, and/or alternatively, the value of LINE_RESET_THRESHOLD on the line 236 could be proportional to (e.g., be ten percent of) the most recent output voltage VPK_OUT on the line 138 as generated by, for example, a voltage divider 260. Use of a proportional threshold LINE_RESET_THRESHOLD on the line 236 will result in the peak detector 200 updating at a consistent time proportional to the peak of the peak detector input voltage PDIN on the line 134 during steady state, leading to more predictable behavior.

To determine when to start resets of the peak detector circuits 202 and 204, the example control signal generator circuit 232 of FIG. 2 includes an example OR gate 240, an example timer 242, and an example blanking circuit 244. The OR gate 240 computes a logic OR of the output LOW_LINE_DETECT on the line 238 by the comparator 234 and an output 246 of the timer 242. An output 248 of the OR gate 240 is a logic HIGH when either the output LOW_LINE_DETECT on the line 238 is a logic HIGH or the output 246 of the timer 242 is a logic HIGH signifying the timer 242 expired. In some examples, the maximum line period for public mains is 21.3 milliseconds (ms), and the timer 242 counts a time period that is larger than the maximum line half period. Accordingly, in the illustrated example, the timer 242 ensures the peak detector circuits 202 and 204 are reset at least every twelve milliseconds (12 ms). In some applications, input AC voltage can have a different period (e.g., in airplanes where the period is generally 2.5 ms) so in this case we can select shorter time for the timer 242 (e.g., 2.6 ms)

During a blanking interval (e.g., a logic LOW portion of an output on the line 250 of the blanking circuit 244), the peak detector circuits 202 and 204 are prevented from being reset. A logic LOW on the output on the line 250 prevents an output 252 of a logic AND gate 254 from transitioning from a logic LOW to a logic HIGH. The blanking interval prevents resets of the peak detector circuits 202 and 204 from occurring too close together. At the end of a blanking interval and if either the LOW_LINE_DETECT on the line 238 is logic HIGH or the timer 242 has expired, a logic rising edge occurs on the output 252 of the logic AND gate 254. The logic rising edge on the output of the logic AND gate 254 resets the timer 242.

To create the reset signal RESET_TRACK on the line 216 and the reset signal RESET_VPK on the line 230, the example control signal generator circuit 232 includes a first example pulse generator 256 (e.g., a rising edge monostable pulser), and a second pulse generator 258 (e.g., a falling edge monostable pulser). When a rising edge occurs on the output 252 of the logic AND gate 254, the pulse generator 256 sets the reset signal RESET_VPK on the line 230 to high, thereby closing switch 226 for a time duration of TIME2, which sets the voltage VPK on the line 218 equal to the voltage VPK_TRACK on the line 206. When a logic falling edge occurs on the reset signal RESET_VPK on the line 230, the second pulse generator 258 sets the reset signal RESET_TRACK on the line 214 to high, thereby closing the switch 214 for a time duration of TIME1, which resets the voltage on the line VPK_TRACK 206 to zero.

Figure 3:
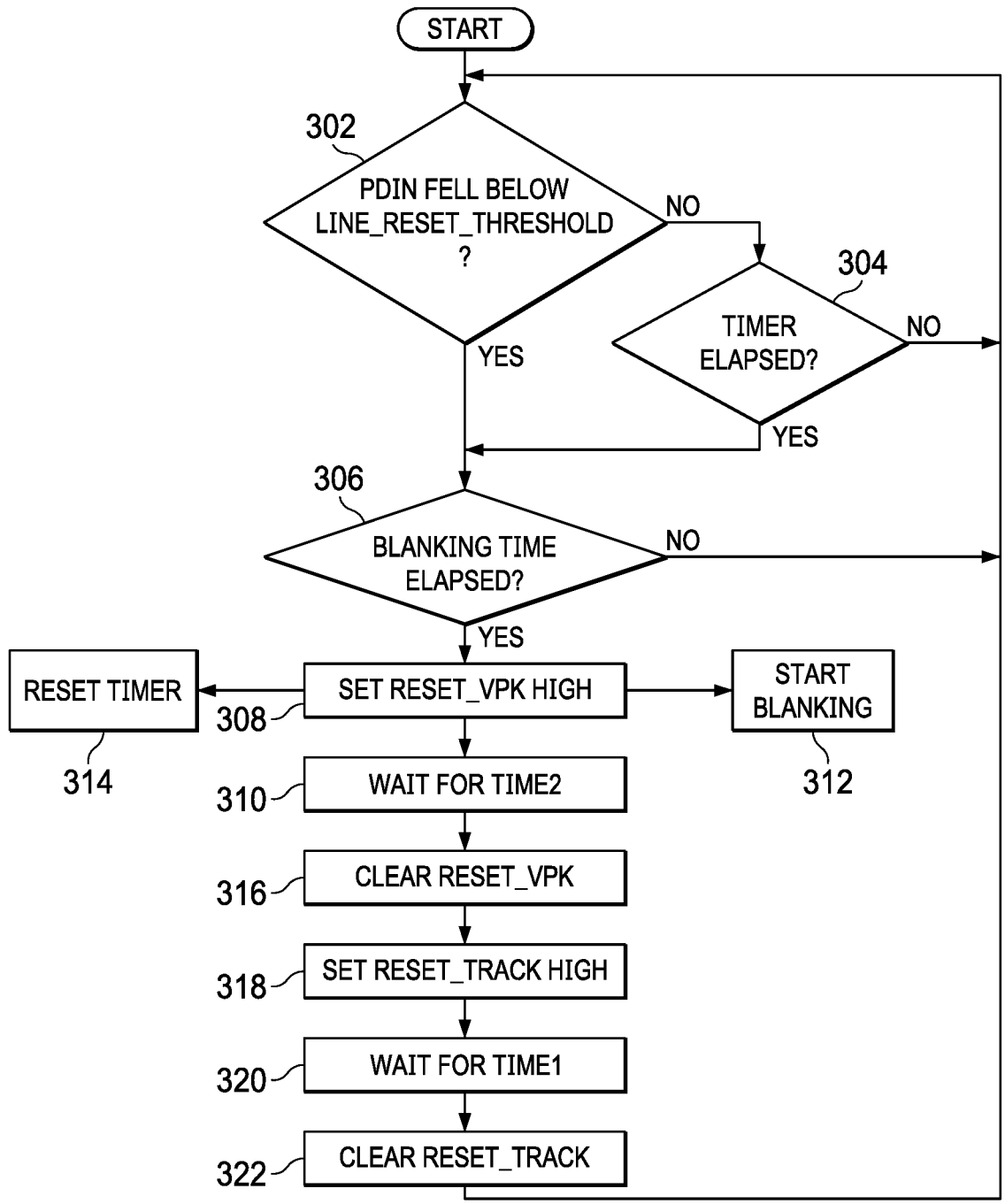
FIG. 3 is a flowchart of example machine-readable instructions, an example hardware implemented state machine, or hardware logic for the example control signal generator circuit of FIG. 2.

A flowchart representative of example hardware logic, hardware implemented state machine, and/or any combination thereof for implementing the control signal generator circuit 232 of FIG. 2 is shown in FIG. 3. Although the example hardware logic, hardware implemented state machines is described with reference to the flowchart illustrated in FIG. 3, many other methods of implementing the example control signal generator circuit 232 may alternatively be used. For example, the order of execution of the blocks may be changed, and/or some of the blocks described may be changed, eliminated, or combined. Additionally, and/or alternatively, any or all of the blocks may be implemented by one or more hardware circuits (e.g., discrete and/or integrated analog and/or digital circuitry, a field programmable gate array (FPGA), an application specific integrated circuit (ASIC), a comparator, an operational-amplifier (op-amp), a logic circuit, etc.), a processor.

The example hardware implemented state machine of FIG. 3 begins with waiting for the peak detector input voltage PDIN on the line 134 to satisfy a threshold (e.g., to fall below the threshold LINE_RESET_THRESHOLD on the line 236) causing a rising edge on the output LOW_LINE_DETECT on the line 238 (block 302), or the timer 242 (e.g., a 12 ms timer) to expire (block 304). If the first of these two events (e.g., as determined by the OR gate 240) occurs during a blanking interval (e.g., as determined by the blanking circuit 244) (block 306), it is ignored, waiting for the other event.

If the first of the two events occurs outside a blanking interval (e.g., 12 ms), a refresh sequence of the peak detectors 202 and 204 is carried out. The example pulse generator 256 (e.g., a rising edge monostable pulser) sets the reset signal RESET_VPK on the line 230 to high, thereby closing switch 226 (block 308) for a time duration of TIME2 (e.g., 4 ms) (block 310), which sets the voltage VPK on the line 218 equal to the voltage VPK_TRACK on the line 206 (block 316). When the switch 226 is closed, a next blanking time is started (block 312) and the timer 242 (e.g., a 12 ms timer) is reset (block 314). Another pulse generator 258 (e.g., a falling edge monostable pulser triggered by the reset of the pulse generator 256) sets the signal RESET_TRACK on the line 214 to high, thereby closing the switch 214 (block 318) for a time duration of TIME1 (e.g., 4 ms) (block 320), which resets the voltage VPK_TRACK on the line 206 to zero. After TIME1 elapses (block 320), the signal RESET_TRACK on the line 214 is reset, thereby opening the switch 214 (block 322). Opening the switch 214 completes the refresh sequence.

TIME1 is selected to be long enough and switch 214 has to be strong enough to allow VPK_TRACK on the line 206 to be discharged to a minimum value (e.g., 4 ms). TIME2 is selected to be long enough and the output of switch 226 has to be strong enough to set the voltage VPK on the line 218 to the voltage VPK_TRACK on the line 206 (e.g., 4 ms).

The duration of the blanking interval (e.g., 12 ms) is selected to be long enough to prevent multiple resets, multiple settings, multiple updates, etc. of the peak detector circuits 202 and 204 during a half wave cycle to space apart instances of resets, settings, updates, etc.

In case a zero crossing is not detected, the timer 242 ensures at least one update of the peak detector circuits 202 and 204 occurs during each half wave cycle. When a zero crossing is detected, the timer 242 avoids triggering a second refresh sequence.

An example operation of the peak detector 200 will be described with reference to the example graph of FIG. 4. The illustrated example of FIG. 4 will be described with reference to five half wave cycles 402, 404, 406, 408 and 410 of the peak detector input voltage PDIN on the line 134. In the example half wave cycle 402, the voltage VPK_TRACK on the line 206 and the voltage VPK_OUT on the line 138 track the peak detector input voltage PDIN on the line 134. When the peak detector input voltage PDIN on the line 134 falls below the threshold LINE_RESET_THRESHOLD (see circle 412), the voltage VPK_TRACK on the line 206 is transferred to the voltage VPK_OUT on the line 138 during a first interval 414 of length TIME1 for use in the half wave cycle 404, and the voltage VPK_TRACK on the line 206 is reset to zero during a second interval 416 of length TIME2.

In the half wave cycle 406, the peak detector input voltage PDIN on the line 134 has a larger peak than the previous half wave cycles 402 and 404. Both the voltage VPK_TRACK on the line 206 and the voltage VPK_OUT on the line 138 instantaneously track the peak detector input voltage PDIN on the line 134, thus preventing any circuit damage to the power converter 100.

As shown in the half wave cycle 406, the voltage VPK_TRACK on the line 206 is held over for the half wave cycle 406 even though the peak detector input voltage PDIN on the line 134 is not as large in half wave cycle 406. This helps prevent any circuit damage to the power converter 100 in case the peak detector input voltage PDIN on the line 134 has any further positive transients.

The example peak detectors disclosed herein may be used in other applications where knowing or estimating the peak of a waveform according to teachings of this disclosure is beneficial. For example, detecting the envelope of AM modulated waveforms, inverter applications such as solar and wind power generation where line voltage or peak (RMS) monitoring is performed.

Figure 4:
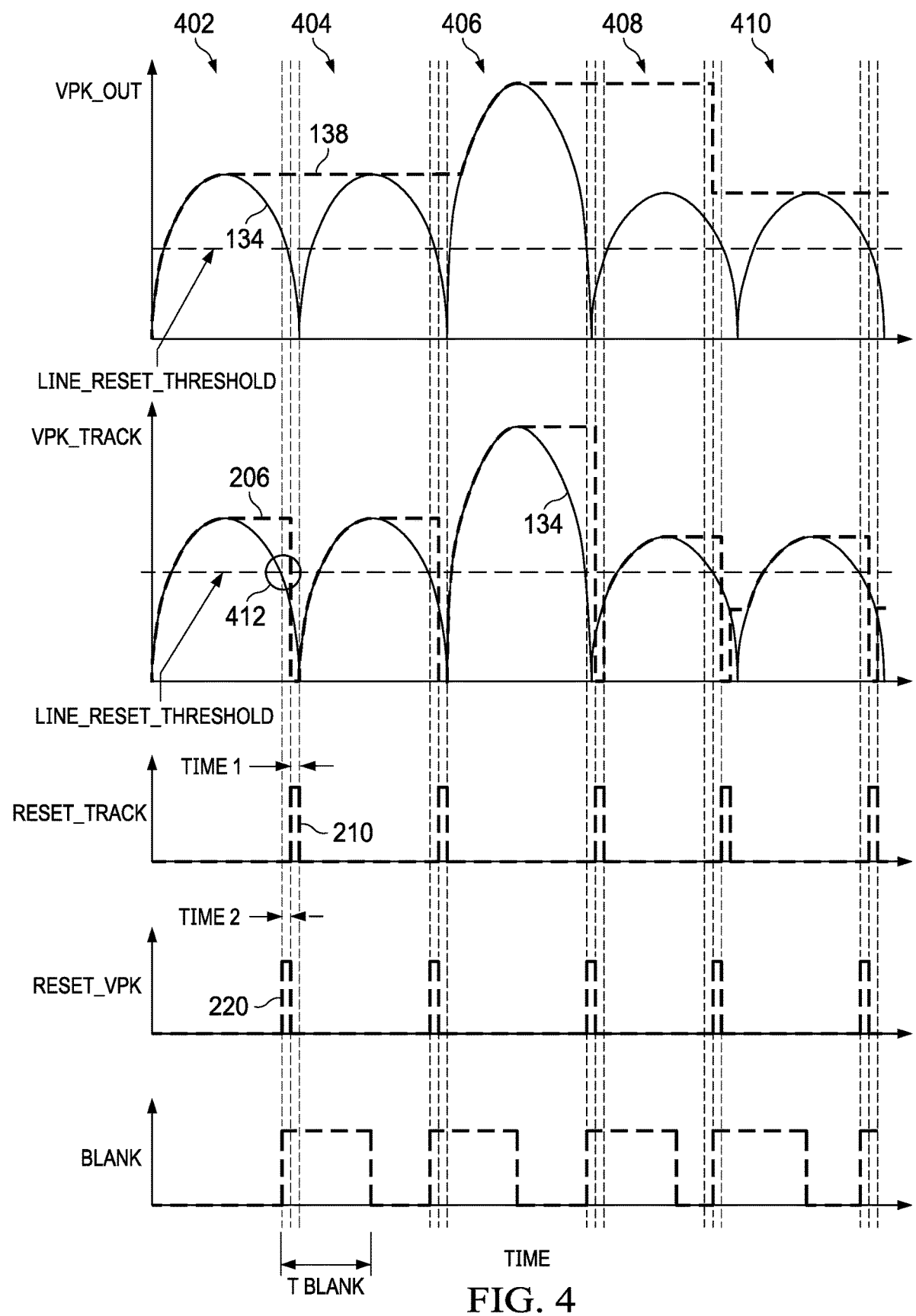
FIG. 4 is a graph showing signals during example operations of the example peak detector of FIG. 2.
Figure 5:
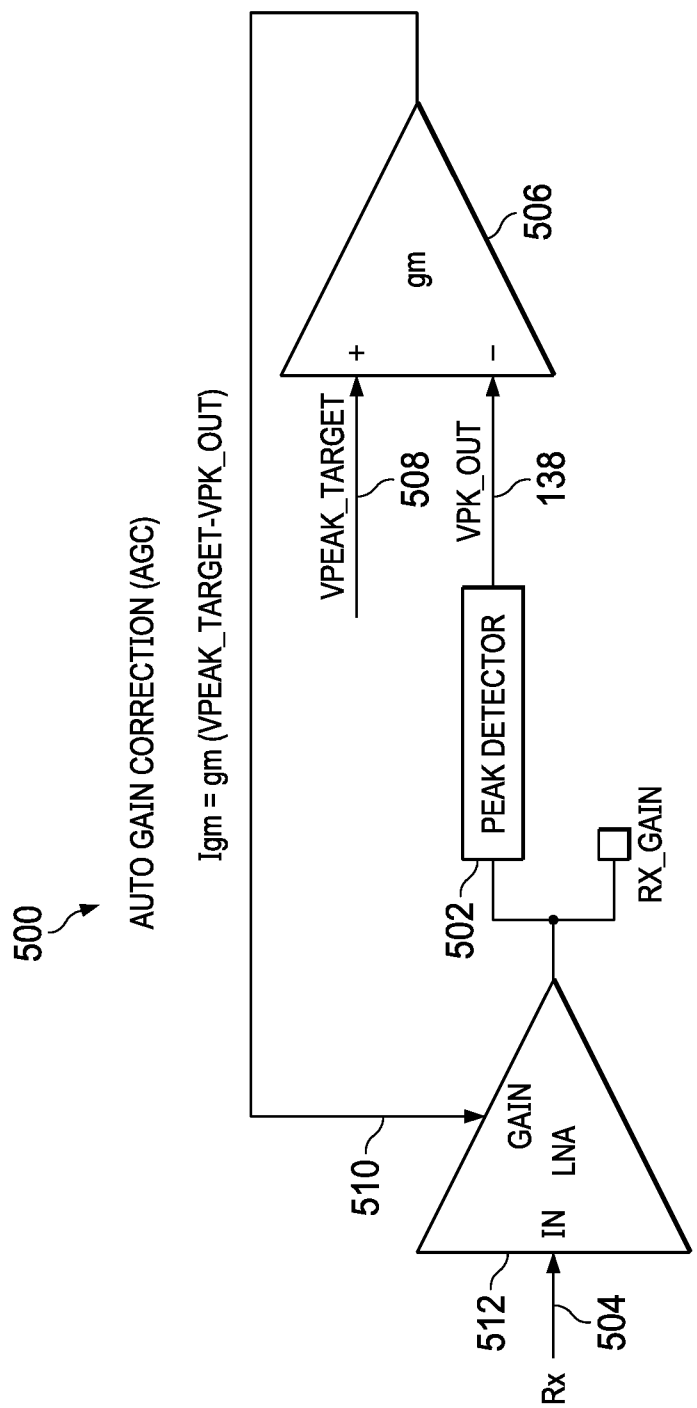
FIG. 5 illustrates an example automatic gain control (AGC) circuit having a peak detector constructed in accordance with teachings of this disclosure.

FIG. 5 illustrates an example AGC circuit 500 having an example peak detector 502, such as that disclosed in connection with FIGS. 2-4. The example peak detector 502 of FIG. 5 tracks peaks of a received signal on a line 504 and outputs the peaks as the example voltage VPK_OUT on the line 138 of FIG. 2. An example comparator 506 compares the voltage VPK_OUT on the line 138 with a target VPEAK_TARGET on a line 508. Outputs of the comparator 506 on a line 510 are used to control the gain of a receive amplifier 512.

Figure 6:
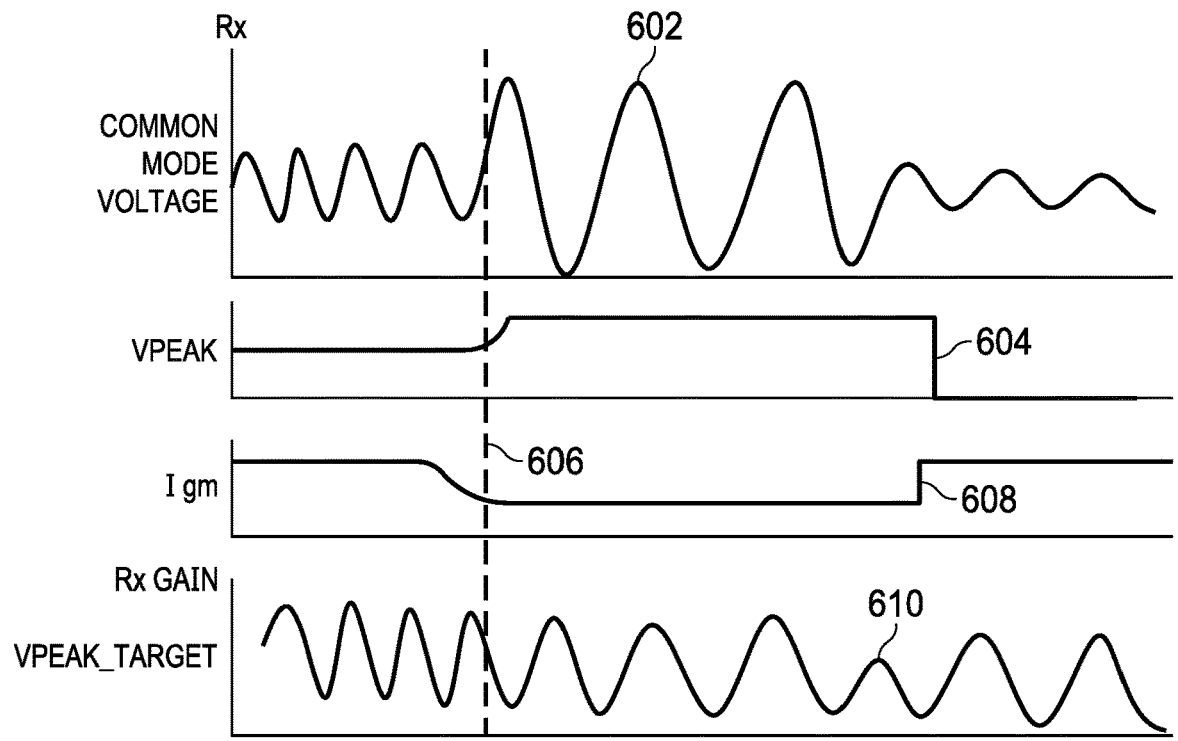
FIG. 6 is a graph illustrating signals during an example application of the AGC circuit of FIG. 5 to an example radio frequency (RF) signal.

FIG. 6 is a graph showing an example application of the automatic gain control circuit 500 of FIG. 5 to an RF signal. In the example of FIG. 6, a received RF signal 602 has a peak amplitude 604 that increased at a time 606. As described above, the peak detector 502 immediately tracks the increase in the peak amplitude 604 of the received signal 602. In response to the increase in the peak amplitude 604 of the received signal 602, the gain 608 of the receive amplifier 514 is lowered, thereby adjusting the gain controlled signal 610 to be generally even. In some examples, a zero-crossing is used rather than ten percent of peak for RF applications.

Figure 7:
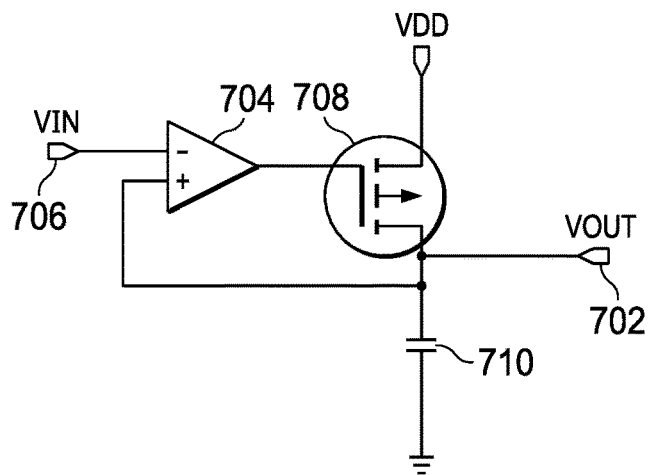
FIG. 7 is a diagram of another example peak detector topology that may be used with the example peak detector circuit of FIG. 2.

While an example peak detector topology including an operational amplifier 208, 220, a diode 210, 222, and a capacitor 212, 224 is shown in FIG. 2, other peak detector topologies may be used. FIG. 7 illustrates another example peak detector topology that may be used to implement the first peak detector circuit 202 and/or the second peak detector circuit 204. Additionally, and/or alternatively, the first peak detector circuit 202 and/or the second peak detector circuit 204 may implement different peak detector topologies.

The example peak detector topology of FIG. 7 varies a gate voltage of an open drain PMOS device 702 based on the output of an operational amplifier 704. When an input voltage 706 is greater than an output voltage 708, the operation amplifier 704 turns on the open drain PMOS device, thereby charging a capacitor 710. When the input voltage 706 is less than the output voltage 708, the operational amplifier 704 turns off the open drain PMOS device, thereby maintaining the output voltage 708 across the capacitor 710.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprise" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

From the foregoing, it will be appreciated that example methods, apparatus and circuits have been disclosed that perform peak detection for power factor correction. The disclosed methods, apparatus and circuits improve the efficiency of power correction by eliminating analog-to-digital conversion, discrete comparators, complex switch network, complex switch control. Disclosed examples in stark contrast require only two half-wave peak-and-hold detectors and simple control logic.

Example peak detection methods, apparatus, systems and circuits are disclosed herein. Further examples and combinations thereof include at least the following.

Example 1 is a peak detector including a first peak-hold circuit having a first input terminal and a first output terminal, the first peak-hold circuit to determine a first peak of a rectified input voltage at the first input terminal during a first time interval, and to track a second peak of the rectified input voltage during a second time interval, the second time interval distinct from the first time interval, and a second peak-hold circuit having a second input terminal and a second output terminal, the second peak-hold circuit to determine, during the second time interval, a greater of the first peak and the second peak, the first output terminal coupled to the second input terminal to convey the first peak and the second peak to the second peak-hold circuit, the greater of the first peak and the second peak output at the second output terminal.

Example 2 is the peak detector of example 1, further including a control signal generator to, when the rectified input voltage satisfies a threshold, set an output of the second peak-hold circuit at the second output terminal to an output of the first peak-hold circuit at the first output terminal.

Example 3 is the peak detector of example 2, wherein the control signal generator is to reset the output of the first peak-hold circuit at the first output terminal.

Example 4 is the peak detector of example 2, wherein the control signal generator is to prevent multiple resets of the output of the first peak-hold circuit at the first output terminal during the second time interval, and prevent multiple settings of the output of the first peak-hold circuit at the first output terminal to the output of the second peak-hold circuit at the second output terminal during the second time interval.

Example 5 is the peak detector of example 2, wherein the control signal generator is to ensure the output of the first peak-hold circuit at the first output terminal is reset during the second time interval, and ensure the output of the second peak-hold circuit at the second output terminal is set to the output of the first peak-hold circuit at the first output terminal during the second time interval.

Example 6 is the peak detector of example 1, wherein the first time interval is a half wave cycle of the rectified input voltage, and wherein the rectified input voltage is a rectified alternating current signal.

Example 7 is the peak detector of example 1, wherein the rectified input voltage is a rectified alternating current voltage, and further including an on_off controller coupled to the second output terminal, the on_off controller to charge and discharge a power factor correction circuit based on the greater of the first peak and the second peak.

Example 8 is the peak detector of example 1, wherein the rectified input voltage is a rectified radio frequency voltage, and further including an automatic gain control circuit having a gain based on the greater of the first peak and the second peak.

Example 9 is a method of controlling a power factor correction circuit, the method comprising tracking a first peak of a waveform during a first cycle portion of the waveform, tracking a second peak of the waveform during a second cycle portion of the waveform; and tracking a greater of the first peak and the second peak during the second cycle portion of the waveform, and selectively charging a power factor correction circuit based on the greater of the first peak and the second peak.

Example 10 is the method of controlling a power factor correction circuit of example 9, further including, when the waveform satisfies a threshold, setting a first output of a first peak-hold circuit tracking the greater of the first peak and the second peak to a second output of a second peak-hold circuit tracking the second peak.

Example 11 is the method of controlling a power factor correction circuit of example 10, further including resetting the second output of the second peak-hold circuit.

Example 12 is the method of controlling a power factor correction circuit of example 10, further including preventing multiple settings of the first output of the first peak-hold circuit to the second output of the second peak-hold circuit during the second cycle portion, and preventing multiple resets of the second output of the second peak-hold circuit during the second cycle portion.

Example 13 is the method of controlling a power factor correction circuit of example 10, further including ensuring the first output of the first peak-hold circuit is set to the second output of the second peak-hold circuit during the second cycle portion, and ensuring the second output of the second peak-hold circuit is reset during the second cycle portion.

Example 14 is the controlling a power factor correction circuit in the waveform of example 9, wherein the first cycle portion is a half wave cycle of an alternating current signal.

Example 15 is a peak detector including:
a first peak-hold circuit having a first input terminal and a second input terminal;
a second peak-hold circuit having a third input terminal coupled to the first input terminal, and a fourth output terminal, the second peak-hold circuit including:
a first operational amplifier having a fifth terminal, a sixth terminal and a seventh terminal, the fifth terminal coupled to the third input terminal;
a first diode having an eighth terminal and a ninth terminal, the eighth terminal coupled to the seventh terminal, and the ninth terminal coupled to the fourth output terminal;
a first switch having a tenth terminal, an eleventh terminal and a twelfth terminal, the tenth terminal coupled to the seventh terminal and the eighth terminal, the eleventh terminal coupled to the ninth terminal and the fourth output terminal, and the twelfth terminal coupled to a first reset signal; and
a first capacitor having a thirteenth terminal and a fourteenth terminal, the thirteenth terminal coupled to the fourth output terminal, the sixth terminal, the ninth terminal and the eleventh terminal, and the fourteenth terminal coupled to ground.

Example 16 is the peak detector of example 15, wherein the first peak-hold circuit includes:
a second operational amplifier having a sixteenth terminal, a seventeenth terminal and an eighteenth terminal, the sixteenth terminal coupled to the first input terminal;
a second diode having a nineteenth terminal and a twentieth terminal, the nineteenth terminal coupled to the eighteenth terminal, and the twentieth terminal coupled to the second output terminal;
a second capacitor having a twenty-first terminal and a twenty-second terminal, the twenty-first terminal coupled to the second output terminal, the seventeenth terminal and the twentieth terminal, and the twenty-second terminal coupled to ground; and
a second switch having a twenty-third terminal, an twenty-fourth terminal and a twenty-fifth terminal, the twenty-third terminal coupled to the second output terminal, the twenty-first terminal and the twentieth terminal, the twenty-fourth terminal coupled to ground, and the twenty-fifth terminal coupled to a second reset signal.

Example 17 is the peak detector of example 16, further including a logic circuit including:
a first pulse generator having a first output coupled to the twelfth terminal to provide the first reset signal; and
a second pulse generator having a first input coupled to the first output, and a second output coupled to the twenty-fifth terminal to provide the second reset signal.

Example 18 is the peak detector of example 17, wherein the logic circuit further includes a blanking circuit having a third output coupled to the first input to space apart instances of the first reset signal and instances of the second reset signal.

Example 19 is the peak detector of claim 15, further including an on_off controller to charge and discharge a power factor correction circuit based on the greater of the first peak and the second peak.

Example 20 is the peak detector of claim 15, further including an automatic gain control circuit having a gain based on the greater of the first peak and the second peak.

Although certain example methods, apparatus and circuits have been disclosed herein, the scope of coverage of this patent is not limited thereto. On the contrary, this patent covers all methods, apparatus and circuits fairly falling within the scope of the claims of this patent.

What is claimed is:

1. A peak detector, comprising:
a first peak-hold circuit having a first input terminal and a first output terminal, the first peak-hold circuit to determine a first peak of a rectified input voltage at the first input terminal during a first time interval, and to track a second peak of the rectified input voltage during a second time interval, the second time interval distinct from the first time interval; and
a second peak-hold circuit having a second input terminal and a second output terminal, the second peak-hold circuit to determine, during the second time interval, a greater of the first peak and the second peak, the first output terminal coupled to the second input terminal to convey the first peak and the second peak to the second peak-hold circuit, the greater of the first peak and the second peak output at the second output terminal.

2. The peak detector of claim 1, further including a control signal generator to, when the rectified input voltage satisfies a threshold, set an output of the second peak-hold circuit at the second output terminal to an output of the first peak-hold circuit at the first output terminal.

3. The peak detector of claim 2, wherein the control signal generator is to reset the output of the first peak-hold circuit at the first output terminal.

4. The peak detector of claim 2, wherein the control signal generator is to:
prevent multiple resets of the output of the first peak-hold circuit at the first output terminal during the second time interval; and
prevent multiple settings of the output of the first peak-hold circuit at the first output terminal to the output of the second peak-hold circuit at the second output terminal during the second time interval.

5. The peak detector of claim 2, wherein the control signal generator is to:
ensure the output of the first peak-hold circuit at the first output terminal is reset during the second time interval; and
ensure the output of the second peak-hold circuit at the second output terminal is set to the output of the first peak-hold circuit at the first output terminal during the second time interval.

6. The peak detector of claim 1, wherein the first time interval is a half wave cycle of the rectified input voltage, and wherein the rectified input voltage is a rectified alternating current signal.

7. The peak detector of claim 1, wherein the rectified input voltage is a rectified alternating current voltage, and further including an on_off controller coupled to the second output terminal, the on_off controller to charge and discharge a power factor correction circuit based on the greater of the first peak and the second peak.

8. The peak detector of claim 1, wherein the rectified input voltage is a rectified radio frequency voltage, and further including an automatic gain control circuit having a gain based on the greater of the first peak and the second peak.

9. A method of controlling a power factor correction circuit, the method comprising:
   tracking a first peak of a waveform during a first cycle portion of the waveform;
   tracking a second peak of the waveform during a second cycle portion of the waveform; and
   tracking a greater of the first peak and the second peak during the second cycle portion of the waveform;
   selectively charging a power factor correction circuit based on the greater of the first peak and the second peak; and
   when the waveform satisfies a threshold, setting a first output of a first peak-hold circuit tracking the greater of the first peak and the second peak to a second output of a second peak-hold circuit tracking the second peak.

10. The method of controlling a power factor correction circuit of claim 9, further including resetting the second output of the second peak-hold circuit.

11. The method of controlling a power factor correction circuit of claim 9, further including:
   preventing multiple settings of the first output of the first peak-hold circuit to the second output of the second peak-hold circuit during the second cycle portion; and
   preventing multiple resets of the second output of the second peak-hold circuit during the second cycle portion.

12. The method of controlling a power factor correction circuit of claim 9, further including:
   ensuring the first output of the first peak-hold circuit is set to the second output of the second peak-hold circuit during the second cycle portion; and
   ensuring the second output of the second peak-hold circuit is reset during the second cycle portion.

13. The method of controlling a power factor correction circuit of claim 9, wherein the first cycle portion is a half wave cycle of an alternating current signal.

14. A peak detector, comprising:
   a first peak-hold circuit having a first input terminal and a second input terminal;
   a second peak-hold circuit having a third input terminal coupled to the first input terminal, and a fourth output terminal, the second peak-hold circuit including:
      a first operational amplifier having a fifth terminal, a sixth terminal and a seventh terminal, the fifth terminal coupled to the third input terminal;
      a first diode having an eighth terminal and a ninth terminal, the eighth terminal coupled to the seventh terminal, and the ninth terminal coupled to the fourth output terminal;
      a first switch having a tenth terminal, an eleventh terminal and a twelfth terminal, the tenth terminal coupled to the seventh terminal and the eighth terminal, the eleventh terminal coupled to the ninth terminal and the fourth output terminal, and the twelfth terminal coupled to a first reset signal; and
      a first capacitor having a thirteenth terminal and a fourteenth terminal, the thirteenth terminal coupled to the fourth output terminal, the sixth terminal, the ninth terminal and the eleventh terminal, and the fourteenth terminal coupled to ground.

15. The peak detector of claim 14, wherein the first peak-hold circuit includes:
   a second operational amplifier having a sixteenth terminal, a seventeenth terminal and an eighteenth terminal, the sixteenth terminal coupled to the first input terminal;
   a second diode having a nineteenth terminal and a twentieth terminal, the nineteenth terminal coupled to the eighteenth terminal, and the twentieth terminal coupled to the second output terminal;
   a second capacitor having a twenty-first terminal and a twenty-second terminal, the twenty-first terminal coupled to the second output terminal, the seventeenth terminal and the twentieth terminal, and the twenty-second terminal coupled to ground; and
   a second switch having a twenty-third terminal, an twenty-fourth terminal and a twenty-fifth terminal, the twenty-third terminal coupled to the second output terminal, the twenty-first terminal and the twentieth terminal, the twenty-fourth terminal coupled to ground, and the twenty-fifth terminal coupled to a second reset signal.

16. The peak detector of claim 15, further including a logic circuit including:
   a first pulse generator having a first output coupled to the twelfth terminal to provide the first reset signal; and
   a second pulse generator having a first input coupled to the first output, and a second output coupled to the twenty-fifth terminal to provide the second reset signal.

17. The peak detector of claim 16, wherein the logic circuit further includes a blanking circuit having a third output coupled to the first input to space apart instances of the first reset signal and instances of the second reset signal.

18. The peak detector of claim 14, further including an on_off controller to charge and discharge a power factor correction circuit based on the greater of the first peak and the second peak.

19. The peak detector of claim 14, further including an automatic gain control circuit having a gain based on the greater of the first peak and the second peak.

* * * * *